United States Patent
Shen et al.

(10) Patent No.: US 12,201,031 B2
(45) Date of Patent: Jan. 14, 2025

(54) STRUCTURE AND METHOD FOR MRAM DEVICES HAVING SPACER ELEMENT

(71) Applicant: Taiwan Semiconductor Manufacturing Company, Ltd., Hsinchu (TW)

(72) Inventors: Hsiang-Ku Shen, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/321,524

(22) Filed: May 22, 2023

(65) Prior Publication Data

US 2023/0301197 A1    Sep. 21, 2023

Related U.S. Application Data

(63) Continuation of application No. 17/247,058, filed on Nov. 25, 2020, now Pat. No. 11,659,774.

(51) Int. Cl.
| | |
|---|---|
| *H10N 50/10* | (2023.01) |
| *G11C 11/16* | (2006.01) |
| *H01F 10/32* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ........... *H10N 50/10* (2023.02); *G11C 11/161* (2013.01); *H01F 10/3254* (2013.01); *H10B 61/22* (2023.02); *H10N 50/01* (2023.02); *H10N 50/80* (2023.02); *H10N 50/85* (2023.02)

(58) Field of Classification Search
CPC ....... H01L 43/08; H01L 27/228; H01L 43/02; H01L 43/10; H01L 43/12; G11C 11/161; H01F 10/3254
USPC ......................................................... 257/421
See application file for complete search history.

(56) References Cited

U.S. PATENT DOCUMENTS

| | | | |
|---|---|---|---|
| 9,356,231 B2 | 5/2016 | Sung et al. | |
| 9,502,466 B1 * | 11/2016 | Chuang | H10N 70/841 |
| 9,847,473 B2 | 12/2017 | Hsu et al. | |
| 10,797,230 B2 * | 10/2020 | Chuang | G11C 11/161 |
| 2002/0164884 A1 * | 11/2002 | Lishan | H01L 29/66318 |
| | | | 257/280 |
| 2018/0158728 A1 * | 6/2018 | Chu | H10B 63/80 |
| 2019/0221732 A1 * | 7/2019 | Houssameddine | G11C 11/16 |
| 2022/0285436 A1 * | 9/2022 | Shen | H10N 50/01 |
| 2022/0303642 A1 * | 9/2022 | Briercliffe | H04N 21/8358 |
| 2023/0301197 A1 * | 9/2023 | Shen | H10B 61/22 |
| | | | 257/421 |

* cited by examiner

*Primary Examiner* — Jami Valentine Miller
(74) *Attorney, Agent, or Firm* — Haynes and Boone, LLP

(57) ABSTRACT

Methods and devices are provided that include a magnetic tunneling junction (MTJ) element. A first spacer layer abuts sidewalls of the MTJ element. The first spacer layer has a low-dielectric constant (low-k) oxide composition. A second spacer layer is disposed on the first spacer layer and has a low-k nitride composition.

20 Claims, 12 Drawing Sheets

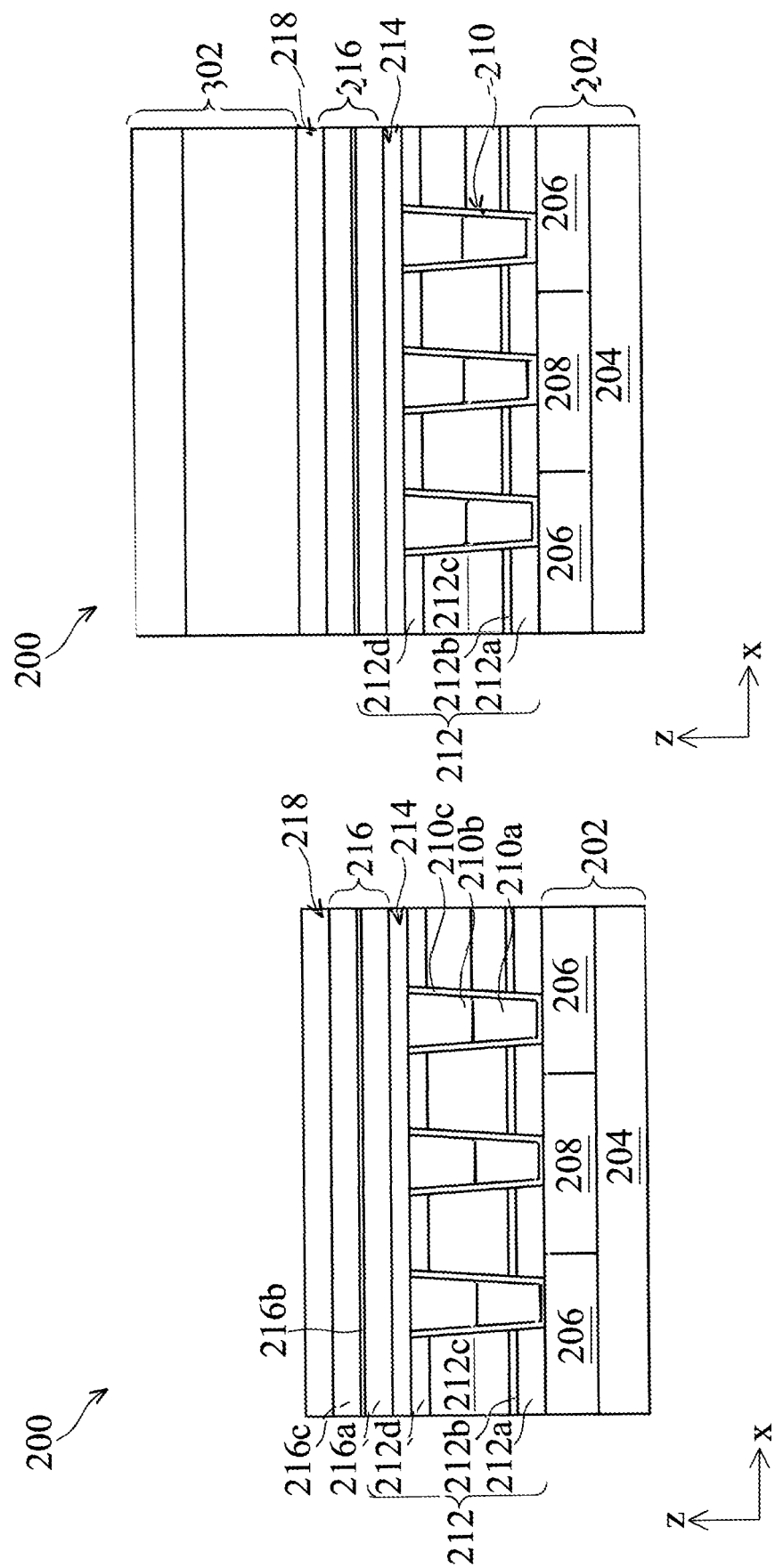

STRUCTURE AND METHOD FOR MRAM DEVICES HAVING SPACER ELEMENT

CROSS-REFERENCE TO RELATED APPLICATIONS

This application is a continuation application of U.S. patent application Ser. No. 17/247,058, filed Nov. 25, 2020, issuing as U.S. Pat. No. 11,659,774, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and particularly magnetic random-access memory (MRAM). In some implementations, MRAM can offer comparable performance to volatile static random-access memory (SRAM) and comparable density with lower power consumption than volatile dynamic random-access memory (DRAM). Compared to NVM Flash memory, MRAM may offer faster access times and suffer less degradation over time. An MRAM cell is formed by a magnetic tunneling junction (MTJ) comprising two ferromagnetic layers which are separated by a thin insulating barrier and operate by tunneling of electrons between the two ferromagnetic layers through the insulating barrier. Although existing approaches in MRAM device formation have generally been adequate for their intended purposes, they have not been entirely satisfactory in all respects. For example, it is desirable to provide MRAM devices and methods of fabricating thereof suitable for high frequency applications.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8A, 9A, 10, 11A, and 12 illustrate cross-sectional views of an embodiment of a semiconductor structure during a fabrication process according to the method of FIGS. 1A and 1B, in accordance with some embodiments.

FIGS. 8B, 9B, and 11B illustrate corresponding top views of an embodiment of a semiconductor structure during a fabrication process according to the method of FIGS. 1A and 1B, in accordance with some embodiments.

DETAILED DESCRIPTION

Figure 1A:
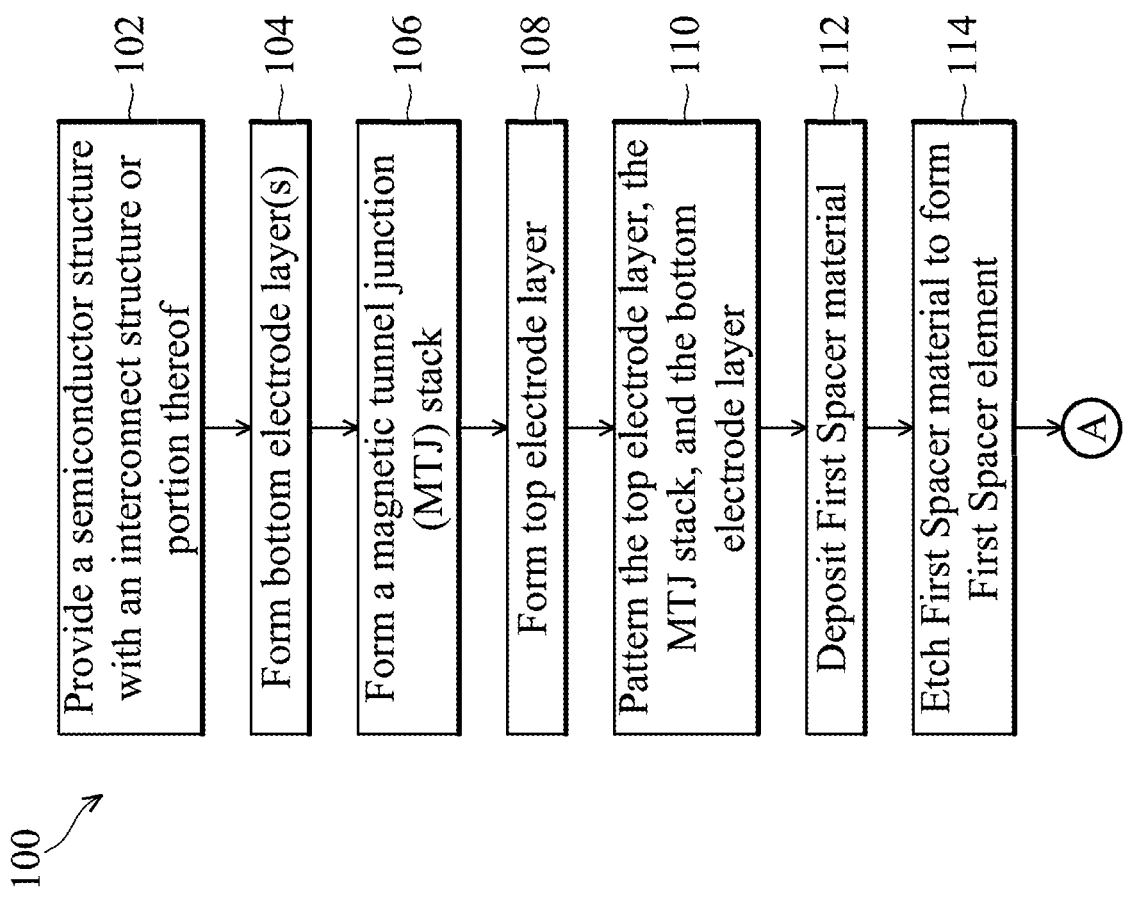
FIGS. 1A and 1B illustrate a flow chart of an embodiment of a method for forming an MRAM device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with an MRAM device.

In some embodiments, the MRAM devices are provided in a memory device region (or MRAM region) of the semiconductor device and the logic devices are provided in a logic device region (or logic region) of the semiconductor device. The memory device region may include an array of MRAM cells (or MRAM devices) arranged into row and columns. The MRAM cells in the same row are connected to a common word line, and the MRAM cells in the same column are connected to a common bit line. The array may be connected to the logic devices of the logic region.

While a portion of a semiconductor device showing three MRAM devices are illustrated by the following figures, the memory array may be any size. After forming certain devices on a semiconductor substrate (e.g., field effect transistors), an overlying multi-layer interconnect (MLI) is provided in which a plurality of MRAM devices may be formed. The MRAM device may include top and bottom electrodes connected to a storage layer(s) such as a magnetic tunnel junction (MTJ) element. Embodiments of the present disclosure provide for reducing the capacitance of the semiconductor device by reducing the capacitance between adjacent MRAM devices through the introduction spacer materials. This in some implementations improves the device's suitability for high frequency applications by improving speed and reducing the Re delay. Configuration of materials have a low dielectric constant surrounding the MTJ element is one aspect discussed herein.

Figure 1B:
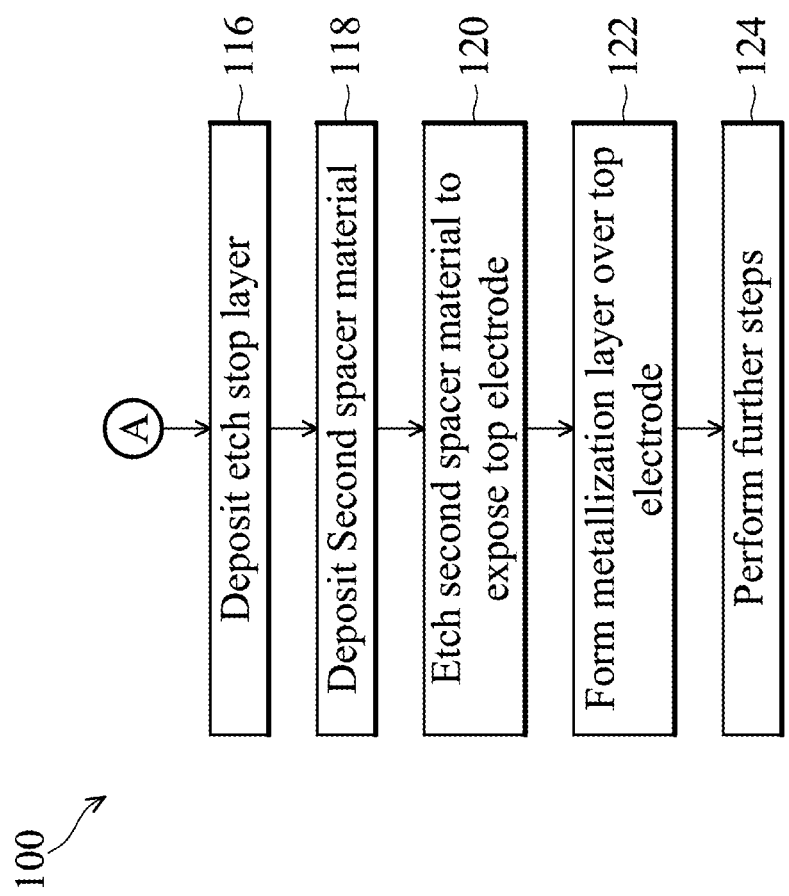

FIGS. 1A and 1B illustrates a flow chart of an embodiment of a method 100 for forming a semiconductor device including an MRAM device in accordance with an embodiment. The method 100 is merely an example, not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with a semiconductor device 200 of FIGS. 2-12, which illustrate various cross-sectional views (or respective top views) of a portion of a semiconductor device during fabrication steps according to the method 100. FIG. 13 provides an embodiment of a semiconductor device that may be fabricated using one or more steps of the method 100.

The method 100 begins at block 102 where a semiconductor structure having an interconnect structure (or portion thereof) is received. The semiconductor structure may include a semiconductor substrate. Upon the semiconductor substrate certain devices may be formed such as field effect transistors (FET) having the associated gate, source, and drain features. Also disposed on the semiconductor structure may be one or more layers of a multi-layer interconnect (or MLI) that includes horizontally extending conductive lines (e.g., metallization layers) and vertically extending conductive vias. The MLI may interconnect one or more of the devices (e.g., FETs) formed on the substrate. In an embodiment, at least one metallization layer of the MLI is formed on the semiconductor structure, while other metallization layers of the MLI may be formed after (e.g., above) the MRAM device fabricated as discussed below. In other words, the MRAM device is disposed within a metallization layer of the MLI.

Referring to the example of FIG. 2, a semiconductor structure 202 is provided including a substrate 204 and overlying layers of an MLI or portion thereof represented by dielectric layer 206 and metallization layer 208. Various other layers and features (e.g., FETs) may be disposed on the semiconductor structure 202, including as discussed below with reference to FIG. 13, but which are not specifically illustrated herein for ease of understanding.

In some embodiments, a semiconductor structure 202 includes a base substrate 204, which may be but is not limited to, a silicon substrate (such as a silicon wafer). Alternatively, the substrate 204 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 204 is a semiconductor on insulator (SOI). In other alternatives, semiconductor substrate 204 may include a doped epitaxial layer, a gradient semiconductor layer, and/or a semiconductor layer overlying another semiconductor layer of a different type, such as a silicon layer on a silicon germanium layer. The semiconductor substrate 204 may or may not include doped regions, such as a p-well, an n-well, or combinations thereof. As indicated above, the semiconductor substrate 204 may have formed thereon a plurality of gate structures and corresponding source/drain features, and/or other semiconductor device including various passive and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof.

An MLI structure is formed on the semiconductor substrate 204 including an exposed inter-layer dielectric (ILD) layer 206 and an exposed conductive line 208, which extends horizontally in the ILD layer 206. The ILD layer 206 can be an oxide, such as silicon dioxide, tetraethyl orthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), carbon doped oxides, or an extreme low-k dielectric material such as porous carbon doped silicon dioxide. The metal line 208 can be made of a metal, such as aluminum (Al), Cu, or combinations thereof. The ILD layer 206 and/or the metal line 208 may include a multi-layer structure. In some embodiments, the metal line 208 is provided at the nth metallization, n may be 1, or any integer greater than 1. In an embodiment, n is 4 corresponding to a fourth (4) metal layer over a transistor formed on the semiconductor structure 202.

The ILD layer 206 may be formed by PE-CVD, F-CVD, or other suitable methods. In some embodiments, after deposition of the ILD layer 206, openings are etched within the ILD layer 206 and subsequently filled with conductive material to provide for the metal layer 208. Other fabrications processes are also possible including damascene or double damascene processes.

MLI structures such as those including ILD layer 206 and metal layer 208 electrically couple various devices (for example, p-type transistors and/or n-type transistors formed on the semiconductor structure 202, resistors, capacitors, and/or inductors) and/or components (for example, gate electrodes and/or source/drain features of p-type transistors and/or n-type transistors), such that the various devices and/or components can operate as specified by design requirements of semiconductor device 200. MLI structures includes a combination of dielectric layers and electrically conductive layers (e.g., metal layers) such as those discussed above that are configured to form various interconnect structures. The conductive layers are configured to form vertical interconnect features, such as device-level contacts and/or vias, and/or horizontal interconnect features, such as conductive lines like the metal line 208. Vertical interconnect features typically connect horizontal interconnect features in different layers (or different planes) of MLI feature. During operation, the interconnect features are configured to route signals between the devices and/or the components of the semiconductor device 200 and/or distribute signals (for example, clock signals, voltage signals, and/or ground signals) to the devices and/or the components of semiconductor device 200.

The method 100 proceeds to block 104 where a bottom electrode is formed on the semiconductor structure. In an embodiment, the bottom electrode includes a bottom electrode via (BEVA) structure and an overlying bottom electrode layer, also referred to as a plate.

Referring to the example of FIG. 2, a BEVA structure 210 is illustrated. The BEVA structure 210 may be formed within a plurality of dielectric layers 212, illustrated as sub-layers 212a, 212b, 212c, and 212d. In some implementations, the dielectric layers 212 include a plurality of different dielectric compositions. In an embodiment, the dielectric layers 212 include a silicon carbonitride (SiCN) layer 212a, an aluminum oxide (AlO$_x$) layer 212b, an undoped silicon oxide glass (USG) layer 212c, and a capping layer 212d, which are blanket deposited over a top surface of the semiconductor structure 202. In an embodiment, the capping layer 212d may be silicon-rich oxide (SRO), silicon oxycarbide, combinations thereof, and/or other suitable materials. The dielectric layers 212 can be formed by a variety of techniques, including chemical vapor deposition (CVD), low-pressure CVD (LP-CVD), plasma-enhanced CVD (PE-CVD), sputtering, and physical vapor deposition (PVD), and the like. The illustrated configuration is exemplary only and other dielectric layer(s) 212 may be provided. The dielectric layers 212 are suitable to provide isolation between adjacent BEVA 210 of each MRAM device of an array of MRAM devices.

In some implementations, after depositing a stack of dielectric materials forming dielectric layer 212, a masking element, such as hard mask material and/or a photosensitive material, is formed over the dielectric layers 212. An etching process is then carried out according to the pattern provided by the masking element form openings in the dielectric layer 212. The etching process can be performed by a suitable dry etch operation. The etching process may form an opening or trench in the dielectric layers 212 that expose a top surface of the metal line 208. Block 104 may further include forming the BEVA structure 210 within said openings etched in dielectric layers 212.

In an embodiment, the BEVA structure 210 includes a barrier layer 210a, a bottom conductive layer 210b, and a top conductive layer 210c. However, other configurations may also be possible that provide suitable conductive path from the metal line 208 to the bottom electrode layer discussed below. In an embodiment, the barrier layer 210a may comprise a conductive material, such as, for example, titanium (Ti), titanium nitride (TiN), tantalum (Ta), tantalum nitride (TaN), cobalt (Co), combinations thereof, and/or other suitable materials. The barrier layer 210a may be deposited through a process such as atomic layer deposition (ALD), CVD, PVD or other suitable methods. A bottom conductive material 210b is then formed within the opening and over the barrier layer. The bottom conductive material 210b may be formed by a variety of techniques, such as high-density ionized metal plasma (IMP) deposition, high-density inductively coupled plasma (ICP) deposition, sputtering, CVD, PVD, LP-CVD, PE-CVD, ALD, and/or other suitable processes. In an embodiment, the bottom conductive material 210b is copper or other suitable material. The bottom conductive material 210b may fill only a portion of the opening in the dielectric layers 212, in such implementations, the BEVA may further include an upper conductive material 210c formed over the bottom conductive material 210b. In an embodiment, the upper conductive material 210c includes a different material than the bottom conductive material 210b. The upper conductive material 210c may be formed by a variety of techniques, such as high-density IMP deposition, high-density ICP deposition, sputtering, CVD, PVD, LP-CVD, PE-CVD, ALD, and/or other suitable deposition processes. In an embodiment, the upper conductive material 210c of the BEVA 210 is tungsten (W) or other suitable material. After deposition of the material for the upper conductive material a planarization process, such as a chemical mechanical polishing (CMP), may be performed to provide a substantially planar top surface to the BEVA 210.

In other embodiments, the BEVA 210 and the upper and lower conductive materials 210c and 210b may be the same composition and may include tungsten, titanium, tantalum, tungsten nitride, titanium nitride, tantalum nitride, a combination thereof, or other suitable metal or metal compound.

After formation of the BEVA 210, in some implementations of block 104, a conductive material providing the bottom electrode layer or plate of the MRAM device is deposited over the BEVA 210. Referring to the example of FIG. 2, the bottom electrode layer 214 is provided. The bottom electrode 214 includes a conductive material, such as, for example, TiN, TaN, Ti, Ta, combinations thereof, and/or other suitable materials. The bottom electrode layer 214 may be deposited through a process such as ALD, CVD, PVD, plating, or other suitable methods. In some embodiments, in block 104 the material of the bottom electrode layer 214 is conformally deposited over the structure 202; the material may be subsequently patterned with the MTJ element as discussed below.

The method 100 then proceeds to block 106 where a magnetic tunnel junction (MTJ) stack of materials is provided on the semiconductor structure. The MTJ stack of materials may provide a stack of a plurality of layers that are subsequently patterned to form MTJ elements.

Referring to the example of FIG. 2, MTJ layers 216 are illustrated over the bottom electrode layer 214. The MTJ layers 216 may include a plurality of layers. While three layers are illustrated—216a, 216b, and 216c—for ease of understanding, embodiments of the stack of MTJ layers 216 may include many additional layers. In an embodiment, the MTJ layers 216 includes two ferromagnetic layers, illustrated as 216a and 216c, which are separated by a thin insulating layer, illustrated as 216b, which is also referred to as a tunnel barrier layer. One of the two ferromagnetic layers (e.g., ferromagnetic layer 216a) may be a magnetic layer that is pinned to an antiferromagnetic layer of the MTJ layers 216, while the other ferromagnetic layer (e.g., ferromagnetic layer 216c) is a "free" magnetic layer that can have its magnetic field changed to one of two or more values to store one of two or more corresponding data states.

The formed MTJ (provided by the patterning of the MTJ layers 216) uses tunnel magnetoresistance (TMR) to store magnetic fields on the upper and lower ferromagnetic layers. For sufficiently thin insulating layer thicknesses (e.g., about 100 angstrom (Å) or less), electrons can tunnel from one ferromagnetic layer (216a) to another ferromagnetic layer (216c). Data may be written to the cell in a variety of ways. In one method, current is passed between the upper and lower ferromagnetic layers, which induces a magnetic field stored in the free magnetic layer (e.g., ferromagnetic layer 216c). In another method, spin-transfer-torque (STT) is utilized, wherein a spin-aligned or polarized electron flow is used to change the magnetic field within the free magnetic layer (e.g., ferromagnetic layer 216c) with respect to the pinned magnetic layer (e.g., ferromagnetic layer 216a). Other methods to write data may be used. Nonetheless, various data writing methods include changing the magnetic field within a free magnetic layer with respect to a pinned magnetic layer.

Continuing with the discussion of the subsequently formed MTJ element in operation, the resistance of the MTJ changes in accordance with the magnetic fields stored in the ferromagnetic layers (216a, 216c), due to the magnetic tunnel effect. For example, when magnetic fields of the ferromagnetic layers of an MTJ are aligned in direction, a low-resistance state (i.e., a logical "0" state) is provided. If the magnetic field of the magnetic free layer (e.g., ferromagnetic layer 216c) is switched, the magnetic fields in the ferromagnetic layers oppose one another, which gives rise to a high resistance state (i.e., a logical "1" state). Therefore, by measuring the resistance between the ferromagnetic plates of the MTJ element, read circuitry coupled to the MTJ element can determine "0" and "1" data states.

Again, the MTJ element may include numerous layers in addition to the ferromagnetic layer and the tunneling insulating layers including, but not limited to capping layers, antiferromagnetic layers, other pinned layers, pinning layers, barrier layers, multi-layer ferromagnetic layers, synthetic anti-ferromagnetic (SAF) structures, metal layers (e.g., Ru), and/or other suitable layers. Each layer of the MTJ stack 216 is disposed through appropriate layer growth techniques. Some suitable growth techniques comprise sputter deposition, molecular beam epitaxy (MBE), pulsed laser deposition (PLD), ALD, electron beam (e-beam) epitaxy, chemical CVD, or derivative CVD processes further comprising LP-CVD, atomic layer CVD (AL-CVD), ultrahigh vacuum CVD (UHV-CVD), reduced pressure CVD (RP-CVD), combinations thereof, and/or other suitable deposition techniques.

In some embodiments, the ferromagnetic electrode layers 216a and/or 216c of the MTJ stack 216 include Fe, Co, Ni, FeCo, CoNi, CoFeB, FeB, FePt, FePd, CoFeTa, NiFe, CoFe, CoPt, CoPd, FePt, other alloys of Ni, Co, and Fe, and/or other suitable magnetic materials. In some embodiments, the barrier layer 216b of the MTJ stack 216 may comprise, for example, magnesium oxide (MgO), aluminum oxide (e.g., $Al_2O_3$), NiO, GdO, $Ta_2O_5$, $MoO_2$, $TiO_2$, $WO_2$, combinations thereof, and/or other suitable materials. In various embodiments, the MTJ stack 216 has a total height in a range from about 200 Å to about 400 Å. The MTJ stack of layers 216 may be conformally deposited and subsequently patterned to form the individual MTJ elements as discussed below.

The method 100 proceeds to block 108 where a top electrode material layer or plate is formed over the MTJ stack on the semiconductor structure. The top electrode material layer may provide a conductive material for accessing the MTJ element from an upper-side, while the bottom electrode layer (discussed above) provides a conductive material for accessing the MTJ element from a lower-side. Referring to the example of FIG. 2, a top electrode material layer 218 is formed over the MTJ stack 216. The top electrode material layer 218 is a conductive material. In an embodiment, suitable compositions include TiN, TaN, Ti, Ta, combinations thereof, and/or other suitable materials. The top electrode material layer 218 may be deposited through a process such as ALD, CVD, PVD or other suitable methods. In some embodiments, after deposition the top electrode material layer 218 may be planarized in one or more planarization processes (e.g., CMP processes). In some embodiments, the bottom electrode material layer 214 and the top electrode material layer 218 include different conductive material. The top electrode material layer 218 may be conformally deposited and subsequently patterned to form the individual MTJ elements as discussed below.

The method 100 then proceeds to block 110 where the top electrode material, the MTJ stack, and/or the bottom electrode layer are patterned in one or more steps to form each of the MRAM devices of the array of MRAM devices provided in the semiconductor device. The patterning may include using photolithography processes to form a masking element defining the MRAM devices, etching the top electrode material, the MTJ stack, and/or the bottom electrode layer according to the pattern of the masking element, and removing the masking element from the structure after the etching. Various patterning methods are possible including those described below.

In some implementations, a hard mask layer 302 is formed over the top electrode layer 218, such as shown in the example of FIG. 3. The hard mask layer 302 may include one or more patterning layers. In some embodiments, the hard mask layer includes dielectric material such as silicon oxide, silicon nitride, silicon oxynitride, amorphous carbon (APF), or suitable combination thereof. The hard mask layer may be deposited through a process such as CVD or other suitable methods.

Figures 4, 5:
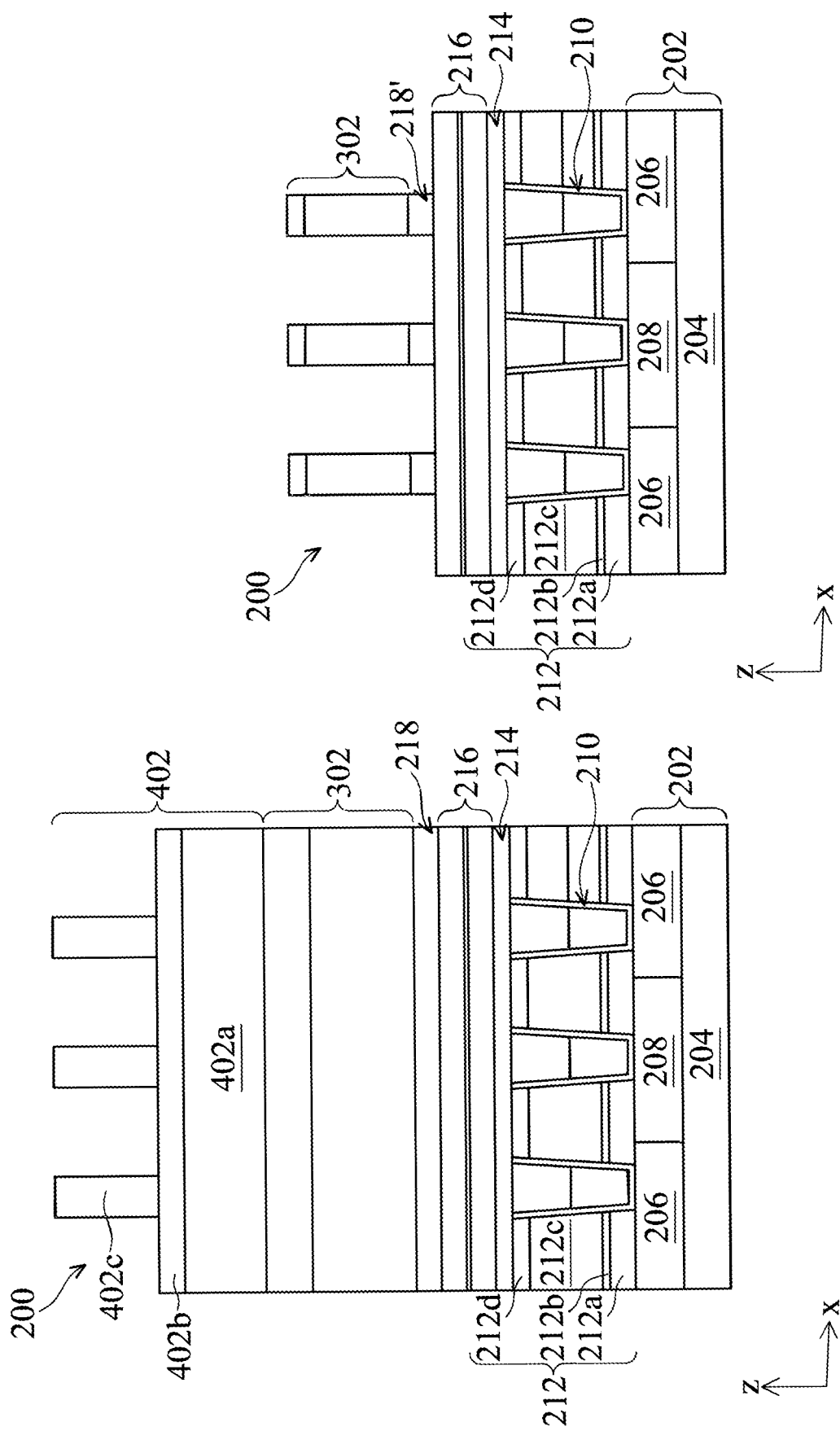

The patterning the hard mask layer 302 may be provided by photolithography and etching processes, such as shown in FIGS. 4 and 5. The photolithography and etching processes may first form and pattern a photoresist layer 402 (FIG. 4) over the hard mask layer 302. The photoresist layer 402 may be a multi-layer resist including at least one photosensitive layer, which is used to pattern the underlying layers such as the hard mask layer 302 using the patterned resist layer 402 as an etching mask. The photoresist layer 402 may include layers such as a bottom anti-reflective coating (BARC) layer 402a, a middle layer 402b and a photosensitive layer 402c of the illustrated embodiment. An exemplary photolithography process may include a lithographic exposure to perform on the photosensitive layer 402c that exposes selected regions to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, a pattern formed in the photosensitive layer 402c (see FIG. 4) is transferred to the middle layer and/or BARC layer 402b, 402c by selectively etching through openings in the developed photosensitive layer 402c, resulting in a patterned multi-layer resist. The patterned photosensitive layer 402c may be in a form of a pillar with a substantially circular shape from a top view. The patterned photosensitive layer 402c provides an array of pillars each defining an MRAM device of an array of MRAM devices of the device 200. Subsequently, such as shown in FIG. 5, the exposed portions of the hard mask layer 302 may be removed by an etching process, such as wet etching, dry etching, Reactive Ion Etching (RIE), ashing, and/or other etching methods according to the pattern of the resist 402. After patterning the hard mask layer 302, resist layer 402 may be removed.

After patterning, or concurrently with patterning the hard mask layer(s) 302, the top electrode material layer 218 is patterned using the patterned hard mask layer 302 and/or the patterned resist layer 402 as an etching mask. For ease of illustration, the patterned top electrode material is annotated as top electrode layer or plate 218' (FIG. 5). Patterning the top electrode material layer 218 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, combinations thereof, and/or other suitable etchants. As another example, a wet etching process may comprise etching in diluted hydrofluoric acid (DHF); potassium hydroxide (KOH) solution; ammonia; a solution containing hydrofluoric acid (HF), nitric acid ($HNO_3$), acetic acid ($CH_3COOH$); combinations thereof, and/or other suitable wet etchants. In some embodiments, the etching process is an RIE process under process parameters such as a source power ranging from about 900 W to about 1200 W, a bias voltage ranging from about 0 V to about 500 V, a gas flow ranging from about 10 sccm to about 200 sccm, and a temperature ranging from about 15 degrees in Celsius to about 55 degrees in Celsius. The etchant gas may include $Cl_2$, $SiCl_4$, $BCl_3$, $NF_3$, $N_2$, $H_2$, $CH_4$, HBr, He, Ar, or a combination thereof. After etching to form the top electrode layer 218', the patterned hard mask layer 302 may be removed.

Figure 6:
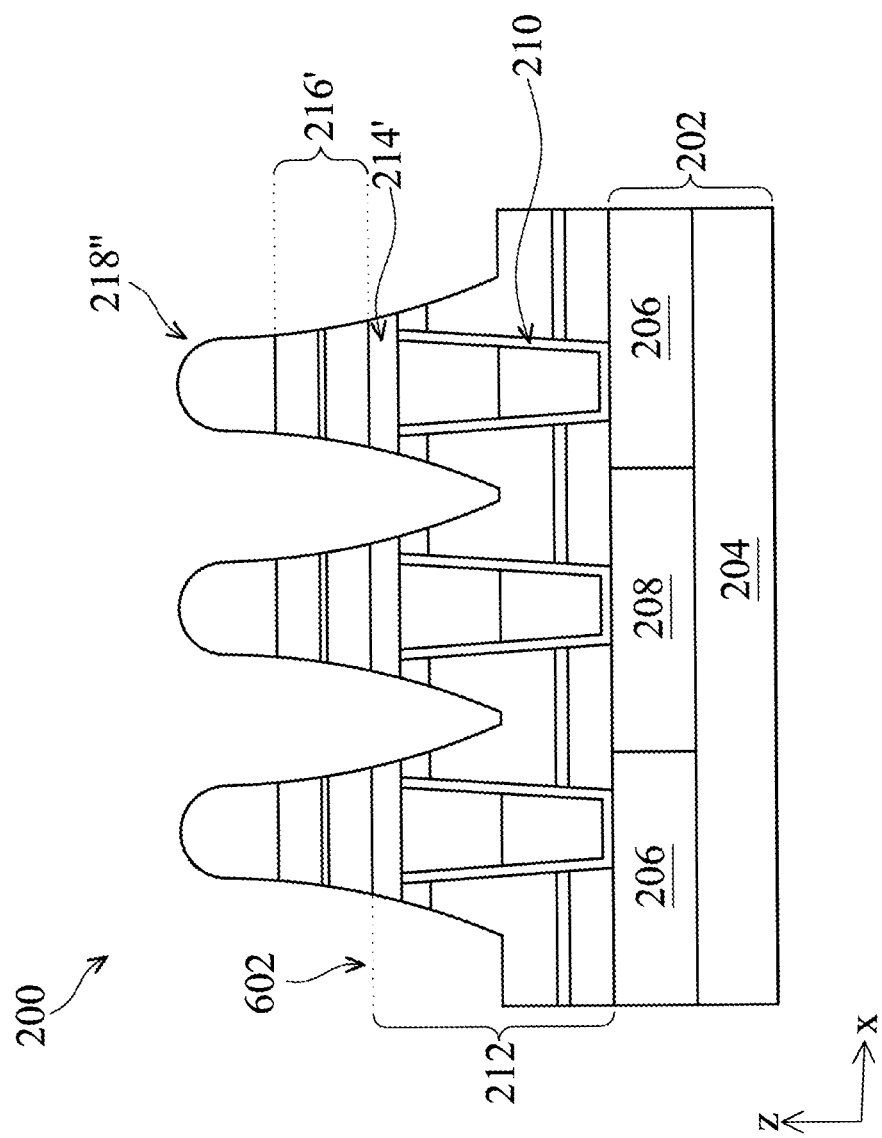
Figure 7:
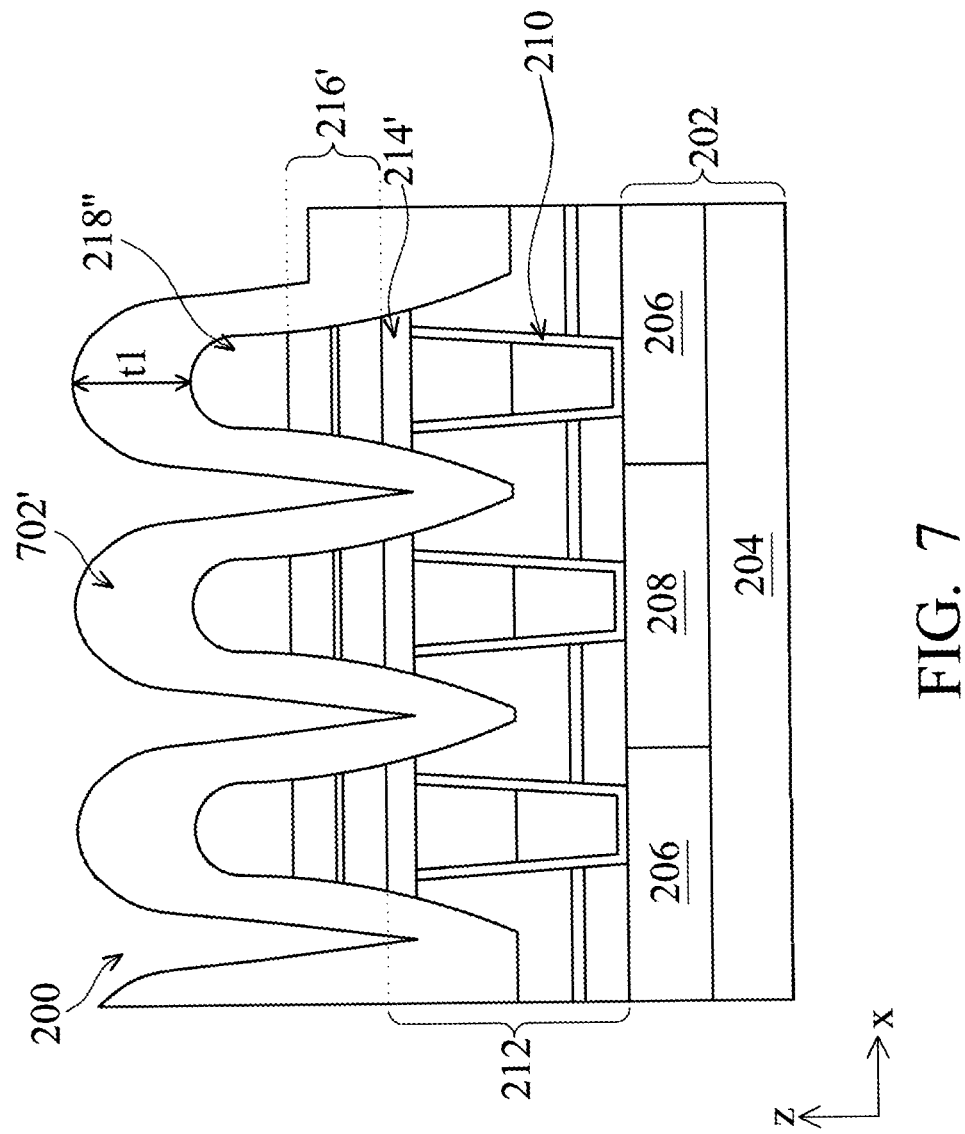
Figure 8:
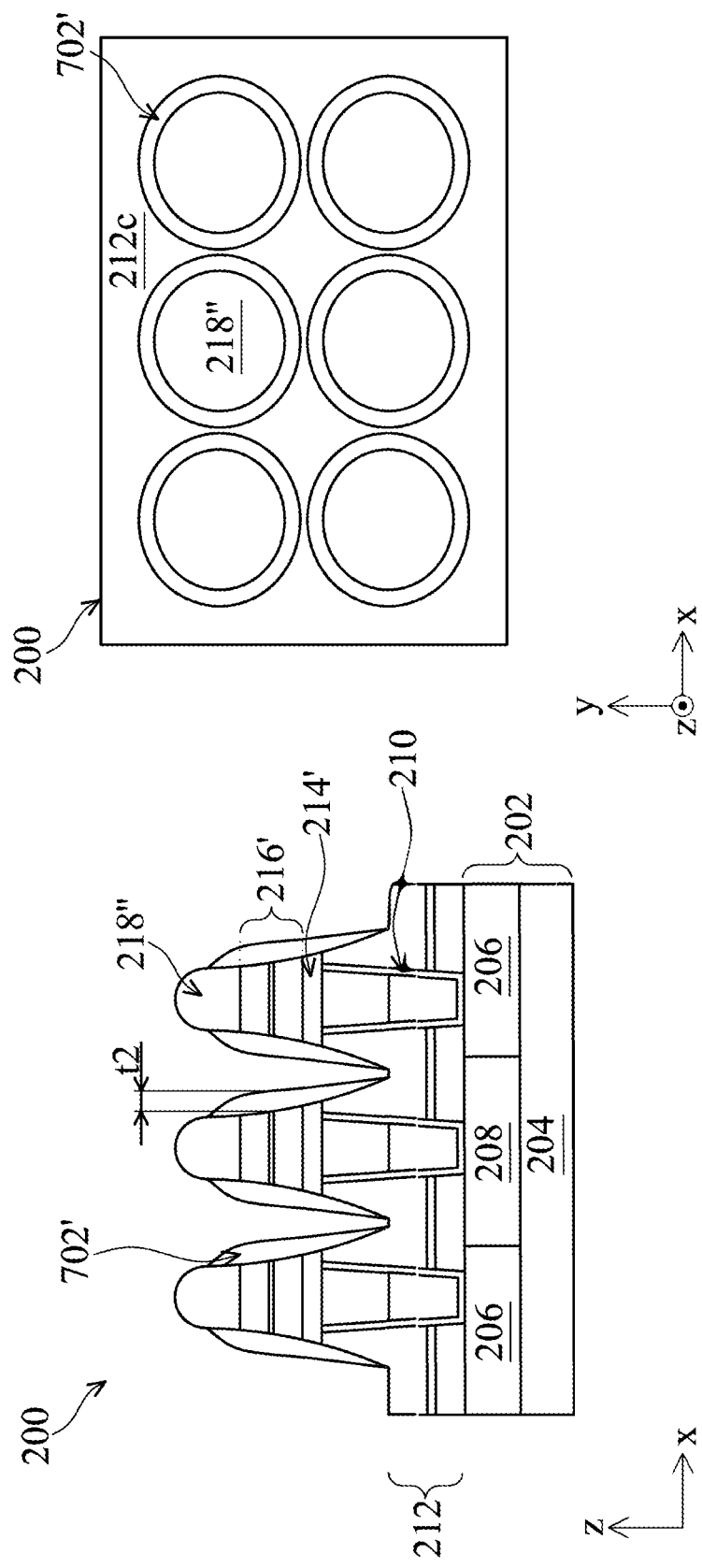
Figure 9:
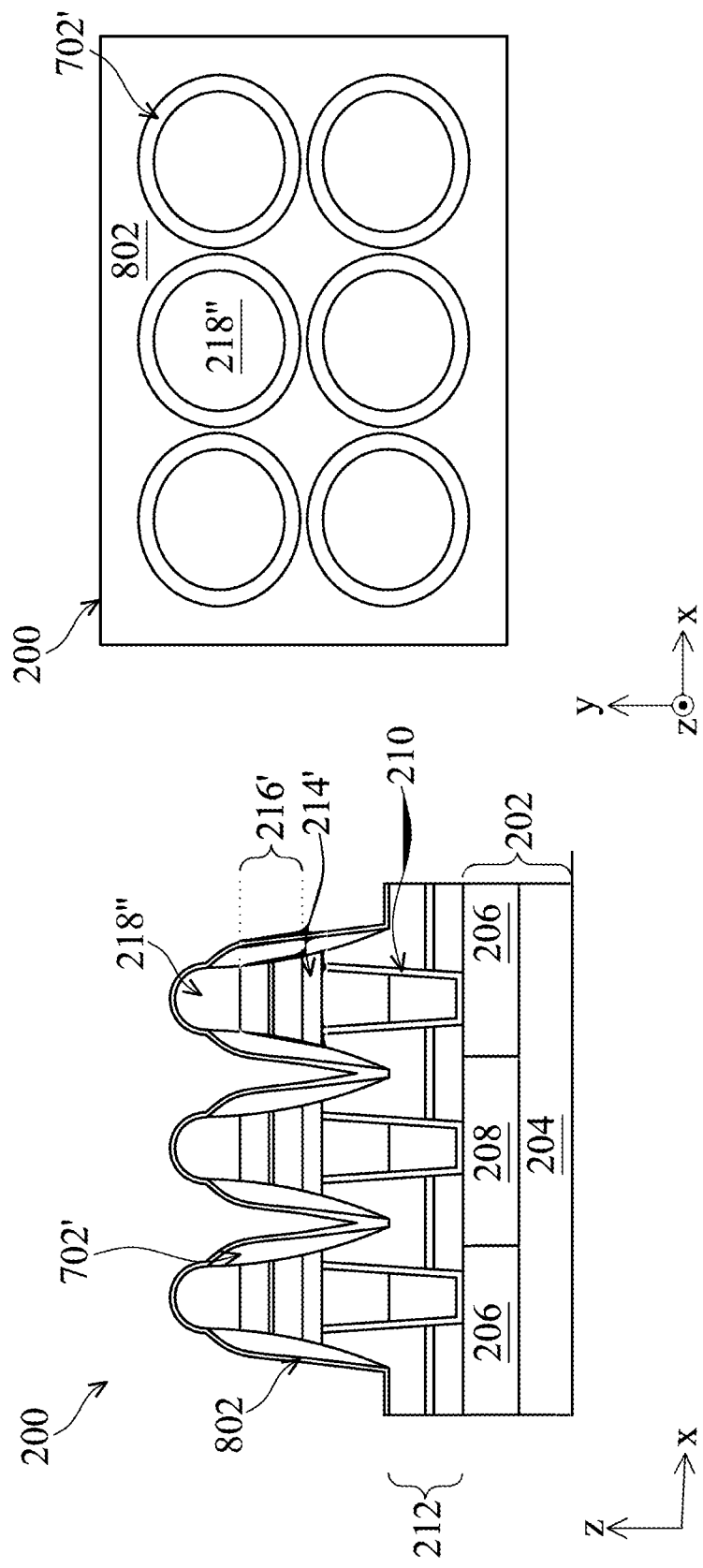
Figure 10:
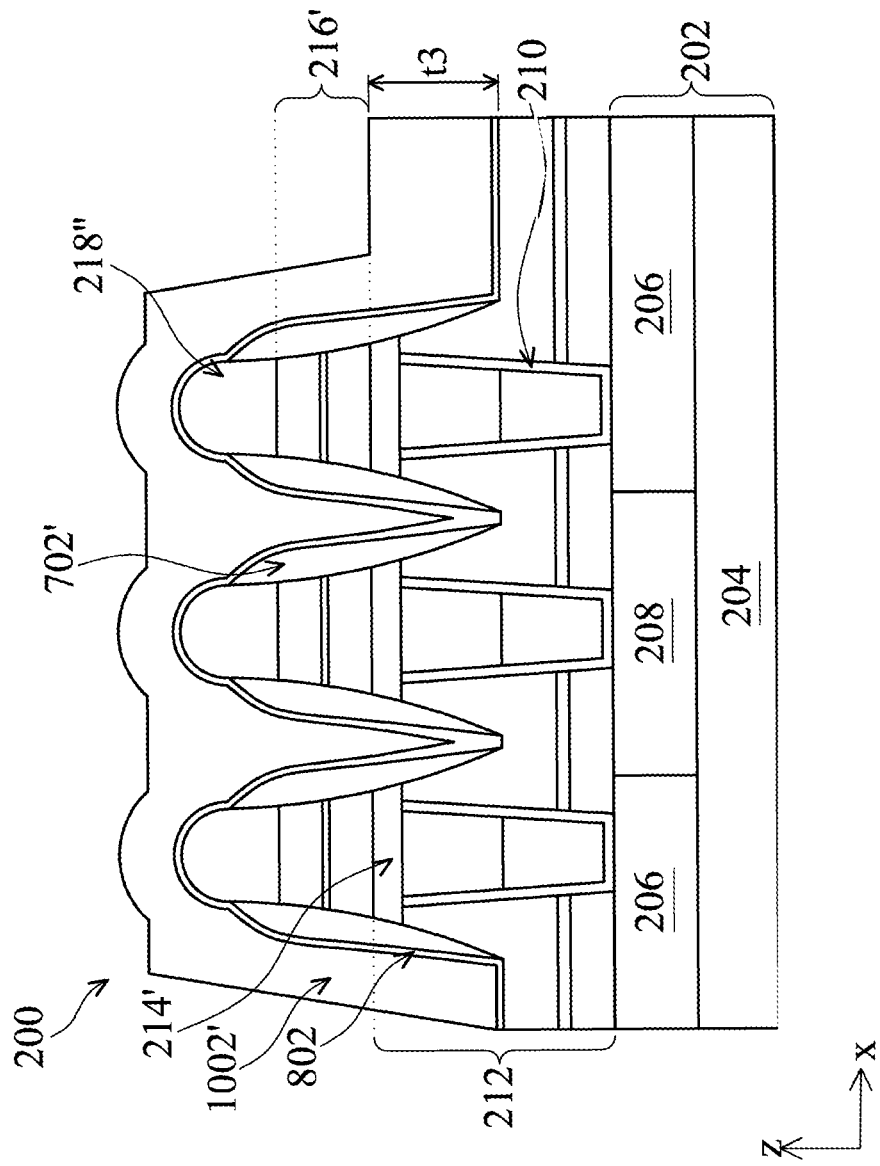
Figure 11:
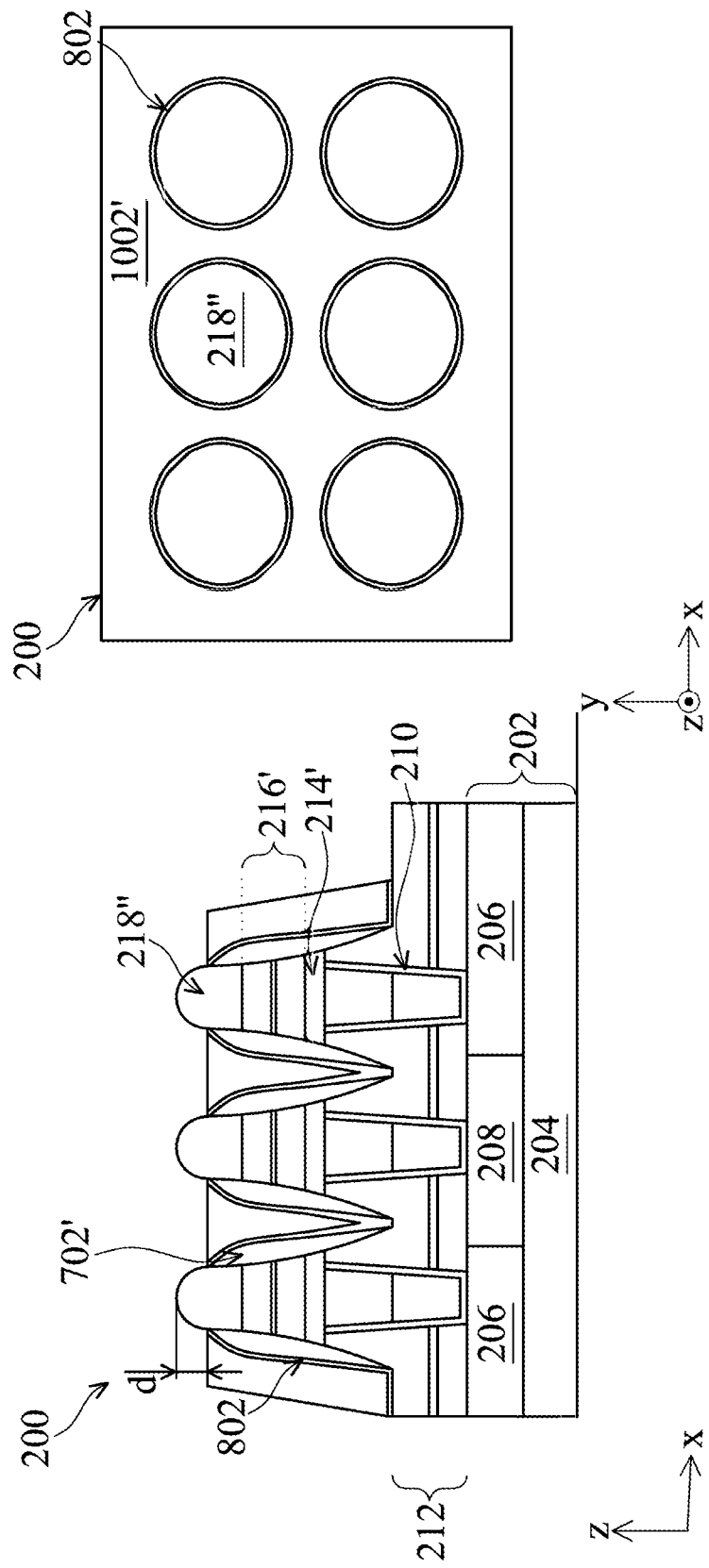

Block 110 may continue to include an etching process to etch through the MTJ stack 216 and the bottom electrode material layer 214 to form a MTJ element 216' and a bottom electrode layer or plate 214' of FIG. 6. In some implementations, etching the MTJ stack 216 and/or the bottom electrode material layer 214 is performed in a same etching process as patterning the top electrode layer 218'. In some implementations, etching the MTJ stack 216 and/or the bottom electrode layer 214 is performed in a separate etching process as forming the top electrode layer 218'. In an embodiment, the etching process to pattern the MTJ stack 216 and/or the bottom electrode material layer 214 is an isotropic dry etching process. In an embodiment, the etching of the MTJ stack 216 and/or the bottom electrode layer 214 is an ion beam etch (IBE) process. In some implementations of the etch, a rounding of the top electrode layer 218' is provided during the etching process (e.g., IBE) of the MTJ stack 216 and/or the bottom electrode 214, the result of which is illustrated as rounded top electrode layer 218" in FIG. 6. The rounding of the top electrode layer 218" as illustrated in FIG. 6 may provide an advantageous surface for subsequent layers to be deposited thereover for example avoiding corners that may risk forming discontinuities in overlying layers. As illustrated in subsequent process steps the rounded top may be removed.

As discussed above, the etching may define an array of pillars (e.g., cylindrical pattern) structures of the top electrode layer 218', the MTJ element 216' and the bottom electrode layer 214' interposed by openings 602. This array of pillars define individual MRAM devices that are to be interconnected in an array format using suitable bit and word lines (e.g., within the MLI) for accessing the MRAM devices for read and write operations.

In some embodiments, the etching processes discussed above continue to extend into the dielectric layer 212. As illustrated in FIG. 6, the openings 602 extend into the dielectric layer 212. The openings 602 may include tapered sidewalls of the dielectric layer 212. In some implementations, the tapered sidewalls result for an etch rate difference of the dielectric materials (e.g., decreased) as opposed to the overlying layers (e.g., electrode layers 214), and/or tuning the etching process to provide for tapered sidewalls. In an embodiment, the sidewalls of the patterned MTJ element 216' and/or the bottom electrode layer 214' are also tapered. The tapering may be beneficial to subsequent gap filling processes for example providing an ease of filling. The etching depth of the dielectric layer 212 may be selected to insure isolation between adjacent MRAM devices. The etching depth of the dielectric layer 212 may be controlled by etching parameters such as etch time end point settings.

The method 100 proceeds to block 112 where a first spacer material is formed over the semiconductor structure including the MTJ element. The first spacer material may be conformally deposited over the semiconductor structure. Referring to the example of FIG. 7, a first spacer material 702 is formed. The first spacer material may be deposited by CVD or ALD processes. In some implementations, the thickness t1 of the first spacer material 702 is between approximately 500 and 550 Angstroms (Å).

In an embodiment, the dielectric constant of the first spacer material is below approximately 7. In an embodiment, the dielectric constant of the first spacer material is between approximately 4 and 7. In an embodiment, the first spacer material is a material with a dielectric constant lower than that of silicon nitride, thus referred to herein as a low-k nitride material. One example composition is that including silicon, carbon and nitride for example silicon nitride doped with carbon or silicon carbon nitride. In an embodiment, the composition is stoichiometric silicon carbon nitride ($Si_{1.5}C_{1.5}N_4$). In an embodiment, the composition is silicon nitride doped with carbon (SiN:C). In an embodiment, the first spacer material including Si, C, N material has a dielectric constant between approximately 4 and 5. In an embodiment, the SiN:C has a dopant concentration, of carbon between approximately 13 and 18 atomic weight %. In some implementations, if the atomic weight percentage of carbon is between approximately 5 and 30%. If the carbon concentration raises above 30% in some embodiments, the etch selectivity of the material may risk degrading, which adversely impacts the desired profile. If the carbon concentration falls below a minimum value (e.g., 5%) the parasitic capacitance may increase.

Another example composition is a dielectric composition including silicon, nitrogen, and boron. In an embodiment, the composition is silicon nitride doped with boron (B) (SiN:B). In an embodiment, the SiN:B composition has a dielectric constant between approximately 4 and 7. The dopant concentration, e.g., boron B, of the material may be between approximately 13 and 18 atomic weight %. Other example compositions include silicon nitride doped with other suitable dopants such as fluorine (F). Similar to as discussed above with respect to carbon, there may be disadvantages to providing concentrations of boron outside of 5 to 30 percent. In an embodiment, the first spacer material is formed by CVD process an in-situ doped with a suitable dopant (e.g., F, B, C). In an embodiment, the first spacer material includes SiN:C or SiCN and is deposited by plasma-enhanced chemical vapor deposition (PECVD) using multi-precursors such as a silicon source (e.g., silane), a nitrogen source (e.g., ammonia, nitrogen) and a carbon source such as an organic group such as alkanes (e.g., CH3, CH4). For example, SiH4, NH3 (or N2), CH4; SiH(CH3)3, NH3; and/or suitable precursors. In some embodiments, the first spacer material is deposited by atomic layer deposition (ALD) including in-situ introduction of a dopant.

It is noted that first spacer material is a nitride-based composition that abuts the MTJ element 216'. In some embodiments, the nitride-based composition abuts the ferroelectric layer(s) of the MTJ element. This beneficially avoids the exposure of the MTJ element 216' to oxygen atoms and thus, avoids undesired oxidation of portions of the MTJ element 216'. The dielectric constant of the first spacer material is selected to achieve desired improvements in capacitance of the array of MRAM devices. A lower-dielectric constant nitride material is a lower tendency to be affected by an externally applied electric field. Thus, the first spacer material is suitable to provide insulation between adjacent MRAM elements provides for a reduction in parasitic capacitance between adjacent devices.

The method 100 then proceeds to block 114 where the first spacer material is etched to form a first spacer element adjacent the MTJ device. In an embodiment, the first spacer material is etched using a dry etching process. The dry etching process may implement a fluorine-containing gas (e.g., $CF_4$, $SF_6$, $CH_2F_2$, $CHF_3$, and/or $C_2F_6$) as an etchant gas. In a further embodiment, the fluorine-containing etchant gas is CHF3. In some embodiments, the dry etching process can use a carrier gas to deliver the etchant gas. The carrier gas includes nitrogen, argon, helium, xenon, other suitable carrier gas constituent, or combinations thereof. Various parameters of the etch process can be tuned to achieve selective etching of spacer material, such as a flow rate of an etchant gas, a concentration of the etchant gas, a concentration of the carrier gas, a power of an RF source, a bias voltage, a pressure, a duration of the etch process, a temperature maintained in a process chamber during the etch process, a temperature of a wafer during the etch process, other suitable etch parameters, or combinations thereof. In some embodiments, the etch process includes multiple steps. In some implementations, the etching of the first spacer material is performed without the use of a masking element in the memory region of the device.

Referring to the example of FIGS. 8A and 8B, the first spacer material 702 (FIG. 7) is etched to form first spacer elements 702'. The first spacer elements 702' extend along the sidewalls of the MTJ element 216' and the bottom electrode layer 214'. The first spacer elements extend into the openings 602 between the dielectric layers 212. The first spacer elements 702' extend partially abutting the sidewalls of the top electrode layer 218".

In some implementations, after etching to form the first spacer element the remaining thickness t2 of the first spacer element is approximately 50-150 Angstroms. In some embodiments, the etching process provides for a first spacer material that decreases in thickness along the tapered sidewalls of the dielectric layers 212. In an embodiment, a terminal point at the bottom of the trench 606 formed in the dielectric layers 212 is void of the first spacer material. In other words, the spacer element 702' of a first MTJ element is not contiguous with the spacer element 702' of a second, adjacent, MTJ element. The thickness of the first spacer element may be selected such that it sufficiently protects the sidewalls of the MRAM element and in particular the MTJ element 216'. If the thickness is too low, oxygen may penetrate the first spacer material to undesirably oxidize the MTJ element 216'. The thickness of the first spacer element may also be selected such that sufficient spacing is provided for adequate gap-filling of the subsequent layers and sufficient second spacer material is provided (e.g., having a lower k value) to improve insulation between adjacent MRAM elements.

The method 100 proceeds to block 116 where an etch stop layer is deposited. Referring to the example of FIGS. 9A and 9B, an etch stop layer 802 is formed. In some implementations, the etch stop layer 802 extends to the logic region of the semiconductor structure. In an embodiment, the etch stop layer 802 is aluminum oxide. Other compositions that provide for etch selectivity to, for example, second spacer dielectric layer discussed below may be possible.

The method 100 then proceeds to block 118 where a second spacer material is formed over the semiconductor structure including the MRAM components. The second spacer material may be formed by CVD processes (e.g., PE-CVD, flowable chemical vapor deposition (F-CVD), or other suitable methods), ALD processes, and/or other suitable deposition methods. The second spacer material may be an oxide with a lower dielectric constant that silicon oxide, referred to herein as a low-k oxide. In an embodiment, the second spacer material has a dielectric constant between approximately 2 and 4. In some embodiments, the dielectric constant of the second spacer material 1002 is between 15 and 80% less than the dielectric constant of the first spacer material 702.

In an embodiment, the second spacer material includes silicon, oxygen, carbon material, such as carbon-doped silicon oxide (SiO:C). In a further embodiment, the SiO:C material may have a dielectric constant between approximately 2.8 and 3.5. In an embodiment, the atomic weight of carbon dopant in the SiO:C material is between approximately 13 and 18 atomic weight %. In an embodiment, the second spacer material includes silicon, oxygen, carbon, and hydrogen or SiO:CH. In a further embodiment, the SiO:CH material may have a dielectric constant between approximately 2 and 2.8. In an embodiment, the atomic concentration of carbon dopant in the SiO:CH material is between approximately 13 and 18 atomic weight % and the hydrogen dopant in the SiO:CH material is between approximately 3 and 5 atomic weight %. If the carbon concentration increases too much, in some embodiments, the etch selectivity of the material may risk degrading, which adversely impacts the desired profile. If the carbon concentration falls below a minimum value (e.g., 5%) the parasitic capacitance may increase.

In an embodiment, the second spacer material includes silicon, oxygen, and a fluorine dopant, or SiO:F. In a further embodiment, the SiO:F material may have a dielectric constant between approximately 3.5 and just under 4. Fluorine dopant may be present at substantially the same atomic weight percentage as the carbon discussed above.

In an embodiment, the second spacer material may be deposited to a thickness t3 of between approximately 400 and 450 Angstroms. The thickness may be selected such that sufficient material overfills the gap between MRAM devices. In an embodiment, the second spacer material forms a non-conformal layer due to the underlying topography of the MTJ elements.

The method 100 proceeds to block 120 where the second spacer material is etched to expose a top electrode. In an embodiment, the second spacer material is etched using a dry etching process. The dry etching process may implement a fluorine-containing gas (e.g., $CF_4$, $SF_6$, $CH_2F_2$, $CHF_3$, and/or $C_2F_6$) as an etchant gas. In a further embodiment, the fluorine-containing etchant gas is CHF3. In some embodiments, the dry etching process can use a carrier gas to deliver the etchant gas. The carrier gas includes nitrogen, argon, helium, xenon, other suitable carrier gas constituent, or combinations thereof. Various parameters of the etch process can be tuned to achieve selective etching of spacer material, such as a flow rate of an etchant gas, a concentration of the etchant gas, a concentration of the carrier gas, a power of an RF source, a bias voltage, a pressure, a duration of the etch process, a temperature maintained in a process chamber during the etch process, a temperature of a wafer during the etch process, other suitable etch parameters, or combinations thereof. In some embodiments, the selective etching process selectively removes the second spacer material while not substantially etching the top electrode and/or the etch stop layer. In some embodiments, the etch process includes multiple steps.

Referring to the example of FIG. 11A, the second spacer material layer 1002 is etched back to form second spacer layer 1002'. The etched back second spacer layer 1002' exposes the top electrode 218". In an embodiment, the second spacer material 1002' provides the upper electrode layer 218" that extends a distance d1 above the top surface of the second spacer layer 1002'. In some embodiments, the distance d1 is between 20 and 100 Angstroms. In a further embodiment, the distance d1 is between approximately 50 and 65 Angstroms. The distance d1 is selected such that sufficient area is available for subsequent contact to the top electrode layer 218", contact resistance of the top electrode is acceptable (e.g., which depends on the thickness of the resultant top electrode), and sufficient margin for protection of the MTJ element is provided. In an embodiment, the etch stop layer 802 provides a stop for the etch back of the second spacer material 1002.

The method 100 proceeds to block 122 where a metallization layer is formed over the top electrode. The metallization layer may be a higher level metal than that of the metallization layer 208. For example, in an embodiment, the metallization layer 208 is provided at metal line level Mn and the metallization layer (1204) formed over the top electrode is metal line level Mn+2.

Figure 12:
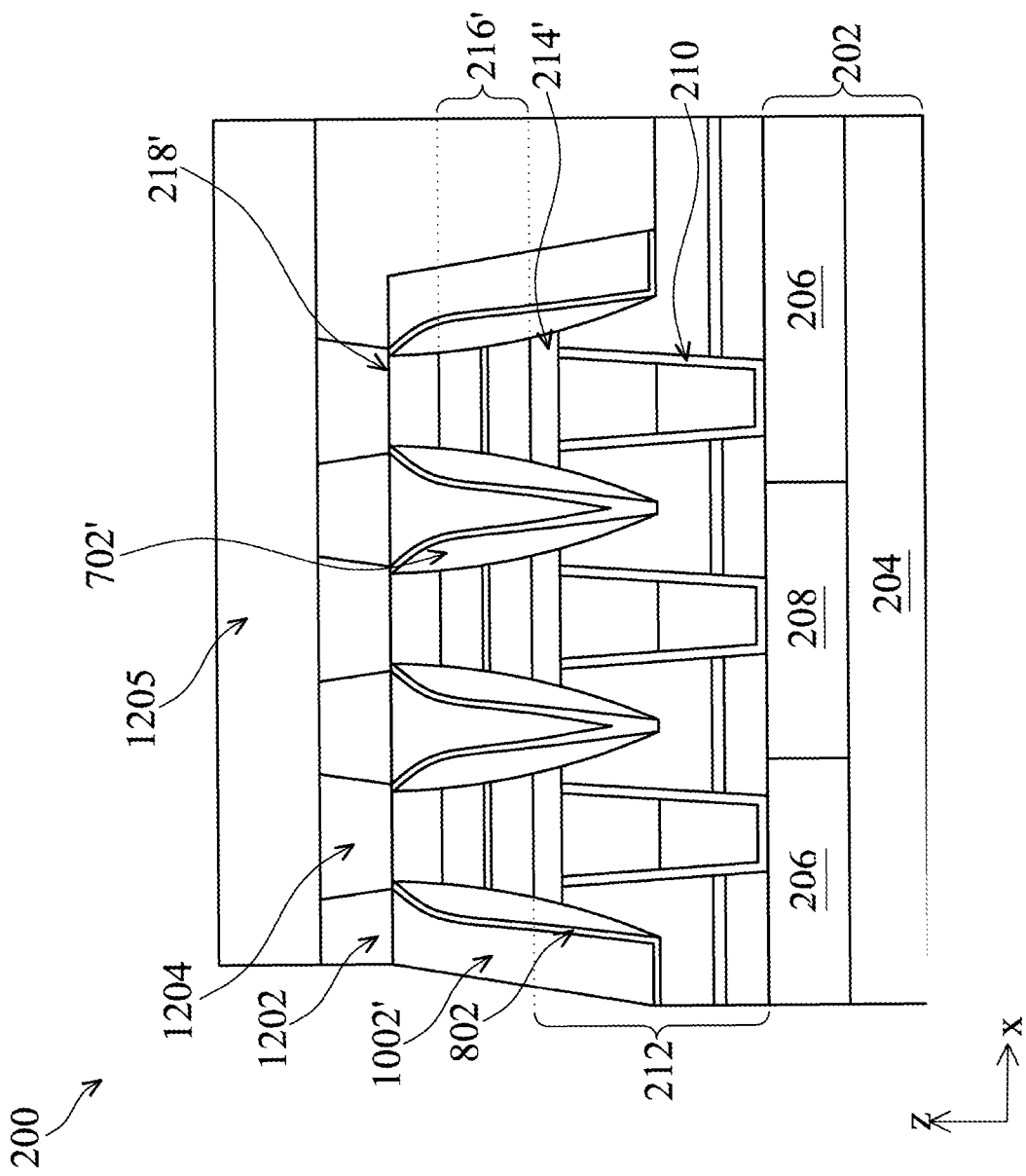
Figure 13:
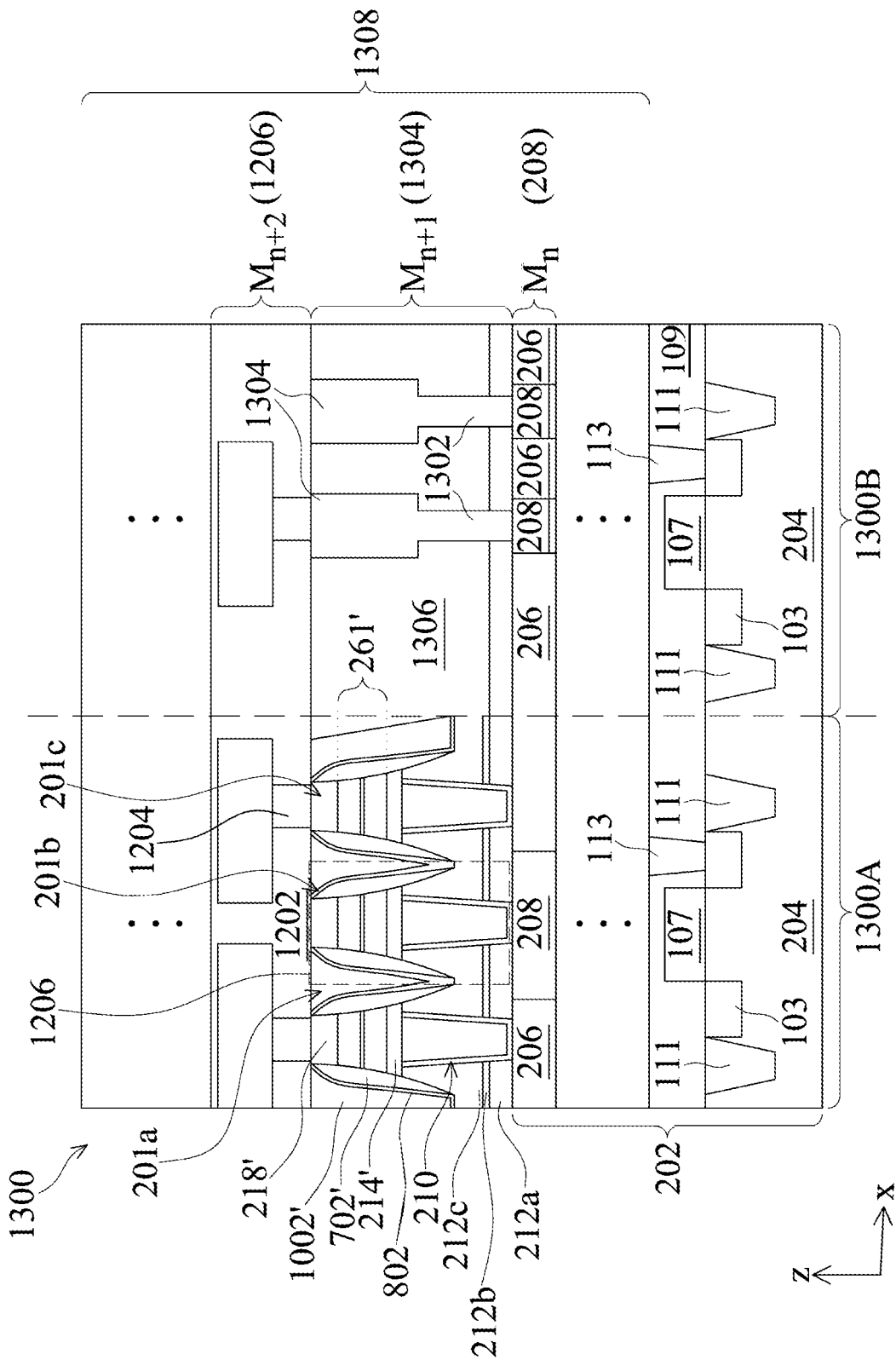
FIG. 13 illustrates a cross-sectional view of a semiconductor device with an MRAM devices, in accordance with an embodiment.

Referring to the example of FIG. 12, an inter-layer dielectric (ILD) layer 1202 over the spacer layer 1002', such as shown in FIG. 12. The ILD layer 1202 may be substantially similar to the ILD layer 206. The ILD layer 1202 may comprise tetraethyl orthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1202 may be formed by PE-CVD, F-CVD, or other suitable methods. In some embodiments, the ILD layer 1202 is formed of a low-k dielectric layer or an extreme low-k dielectric layer, to a thickness of approximately 2500 Å. If an extreme low-k dielectric layer is used, a curing process may be followed after depositing the extreme low-k dielectric layer to increase its porosity, lower the k value, and improve the mechanical strengths. One or more planarization (e.g., CMP) processes may be performed on the ILD layer 1202.

For example, the block 122 may form a via trench and an opening (not shown) in the ILD layer 1202 and deposit conductive materials therein to provide interconnections, such as the top electrode via (TEVA) 1204 that lands on the top electrode 218', such as shown in FIG. 12. In an embodiment, the TEVA 1204 is offset from the top of the electrode 218', such that a portion of the bottom surface of the TEVA 1204 interfaces the etch stop layer 802 and the second spacer layer 1002'. A metal line 1205 may be a metal line providing horizontal routing (e.g., Mn+2). The metal line 1205 is part of a metallic interconnection layer, such as a bit line (e.g., bit line BL) in an MRAM cell array. The top electrode via 1204 electrically connects an MRAM cell to the metallic interconnection layer. In some embodiments, the top electrode via 1204 and the metal line 1205 comprise Cu or W. The top electrode via 1204 and the metal line 1205 can be formed by a damascene or dual-damascene process. In some embodiments, the top electrode via 1204 is substantially similar to the BEVA 210. The TEVA 1204 and the metal line 1205 are part of an MLI as discussed above. In an embodiment, the metal line 1205 provides a bit line, and the BEVA 210 to a metal line 208, which provides a word line.

The method 100 then continues to block 124 where perform further steps such as providing additional metallization layers of the MLI, forming passivation layer(s), and performing more back end of line (BEOL) processes.

Thus, provided in some embodiments the method 100 are embodiments of forming MRAM devices having MTJ elements on a semiconductor structure that can in some implementations provide for a reduced capacitance. The decrease in dielectric constant between MTJ elements provides for a reduced capacitance between adjacent MTJ elements of the array. The reduction in capacitance is provided in some implementations by the configuration and the material selection of the first and/or second spacer elements. The first and/or second spacer elements provide for MTJ elements that allow for higher frequency operation.

Referring now to FIG. 13, an embodiment of a semiconductor device 1300 is provided. The semiconductor device may be substantially similar to the semiconductor device 200 illustrated above and provide similar components that are referred by the same reference numbers for ease of reference to the descriptions above that may apply equally to the device 1300. The device 1300 is illustrated having a plurality of MRAM devices 201, illustrated as 201a, 201b, 201c, in a memory region 1300A and an adjacent logic region 1300B. Logic devices are provided in a logic region 1300B and may be used for implementing write/read logic for accessing the MRAM array of MRAM devices 201 or perform other functions.

Each of the MRAM region 1300A and the logic region 1300B may have a similar transistor structure forming field effect transistors (FETs). The structures include gate structures 107 and adjacent source features 103 and drain features 105 on the semiconductor substrate 204. A gate 107 is positioned between the source 103 and the drain 105 and defines a channel region thereunder. Contact plugs 113 are formed in inter-layer dielectric (ILD) 109 and may be electrically coupled to a terminal FET, such as drain 105. The ILD 109 may be substantially similar to the ILD 1202 or the ILD 206 above. The contact plugs 113 connect to an MLI 1308, which may be substantially similar to the MLI described above with reference to the method 100 of FIGS. 1A and 1B. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 may be formed from a variety of dielectric materials such as an oxide, nitride, low-k materials, and/or other suitable materials. In some embodiments, the ILD 109 may include additional layers such as contact etch stop layers (CESL). The transistors in the transistor structure of the FETs can be planar transistors or non-planar transistor, such as FinFET or gate-all-around (GAA). In some embodiments, a shallow trench isolation (STI) 111 is provided to define and electrically isolate adjacent transistors.

The semiconductor device 200 includes the interconnect structure 1308 (MLI) over the transistor structure. The interconnect structure 1308 includes three adjacent metal layers Mn, Mn+1, Mn+2 and other metal layers not shown. The metal layer 208 is the $n^{th}$ metal layer above the top surface the transistor structure, while the metal layers 1304 and 1206 are the $(n+1)^{th}$ metal layer and the $(n+2)^{th}$ metal layer, respectively. Thus, the metal layers 208, 1304, and 1206 are also referred to metal layers $M_n$, $M_{n+1}$, and $M_{n+2}$ in some embodiments. The number n can be any natural number. For example, n may be 3, 4, 5, 6, or another natural number. In the present embodiment, the MRAM cells 201 including respective MTJ element 216' are implemented in the metal layer Mn+1.

The metal layer Mn includes the ILD layer 206 and metal lines 208 in both the MRAM region 1300A and the logic region 1300B. The ILD layer 206 can be an oxide, such as silicon dioxide, a low-k dielectric material such as carbon doped oxides, or an extreme low-k dielectric material such as porous carbon doped silicon dioxide and extend from the memory region to the logic region. The metal lines 208 can be made of a metal, such as aluminum, copper, or combinations thereof. The metal layer Mn+2 includes the ILD layer 1202 and metal lines 1206 again in both the MRAM region 1300A and the logic region 1300B. The ILD layer 1202 can be an oxide, such as silicon dioxide, a low-k dielectric material such as carbon doped oxides, or an extreme low-k dielectric material such as porous carbon doped silicon dioxide. The metal lines 1206 can be made of a metal, such as aluminum, copper, or combinations thereof.

The metal layer Mn+1 includes the ILD layer 1306 and metal lines 1304 in the logic region 1300B. A via 1302 interconnects the metal lines 1304 to the metal lines 208. The ILD layer 1306 can be an oxide, such as silicon dioxide, a low-k dielectric material such as carbon doped oxides, or an extreme low-k dielectric material such as porous carbon doped silicon dioxide. The metal lines 1304 can be made of a metal, such as aluminum, copper, or combinations thereof. Coplanar with the metal lines 1304 and the vias 1302 are components in the memory region 1300A including the MTJ elements 216' and the BEVA 210 respectively. It is noted that the first spacer element 702; and the second spacer 1002' do not extend to the logic region 1300BIM.

Although not intended to be limiting, one or more embodiments of the present disclosure provide many benefits to a semiconductor device and the formation thereof. For example, embodiments of the present disclosure form an MRAM array where a low-k nitride composition spacer element and a low-k oxide composition spacer element are provided abutting the MTJ elements. This allows for lower capacitance between MTJ elements. Furthermore, embodiments and the compositions of the present disclosure can be readily integrated into existing semiconductor fabrication processes.

In one example aspect, the present disclosure is directed to a semiconductor device including a first magnetic tunneling junction (MTJ) element and a second MTJ element over a semiconductor substrate. A first spacer layer abuts sidewalls of the first MTJ element and the second MTJ element. The first spacer layer has a low-dielectric constant (low-k) oxide composition. A second spacer layer is disposed on the first spacer layer and has a low-k nitride composition.

In a further embodiment, the low-k oxide composition includes silicon, oxygen, and at least one of fluorine or carbon. In an embodiment, the low-k oxide composition has a dielectric constant of less than 4. In an embodiment, the low-k nitride composition includes silicon, nitrogen, and at least one of carbon or boron. In some implementations, the low-k nitride composition has a dielectric constant of less than 7. In an embodiment the device further includes an etch stop layer between the first spacer layer and the second spacer layer. In some embodiments, the low-k nitride composition is silicon nitride doped with carbon and the low-k oxide composition is silicon oxide doped with carbon. In an embodiment, the low-k nitride composition abuts a surface of a ferroelectric layer of the MTJ element.

In another example aspect, the present disclosure is directed to a semiconductor device that includes a bottom electrode plate, a first magnetic tunneling junction (MTJ) element on the bottom electrode plate, and a top electrode plate over the MTJ element. A first spacer layer abuts sidewalls of the first MTJ element, the bottom electrode plate, and the top electrode plate. The first spacer layer includes silicon, nitrogen, and is at least one of carbon or boron. A second spacer layer is on the first spacer layer and is at least one of silicon, oxygen, and at least one of fluorine or carbon.

In a further embodiment, an etch stop layer interposes the first spacer layer and the second spacer layer. In an embodiment, the second spacer layer includes silicon, oxygen, carbon and further includes hydrogen. The first spacer layer may have an atomic weight of between approximately 13 and 18% of carbon.

In yet another example aspect, the present disclosure is directed to a method that includes providing a structure have a bottom electrode material layer, a magnetic tunnel junction (MTJ) stack, and a top electrode material layer. A masking element is formed over the structure. The bottom electrode material layer, the MTJ stack and the top electrode material layer are etched to form a plurality of MTJ elements. A conformal layer of a nitride material is deposited on the plurality of MTJ elements. The conformal layer of nitride material is etched to form first spacer elements on sidewalls of the plurality of MTJ elements. A layer of low-k oxide material comprising silicon, oxygen and at least one dopant is deposited over the first spacer elements and interposes the plurality of MTJ elements.

In a further embodiment of the method, after etching the conformal layer of nitride material an etch stop layer is deposited on the first spacer elements. In an embodiment, the etch stop layer is aluminum oxide. In some implementations, the method includes etching the bottom electrode material layer, the MTJ stack and the top electrode material layer by at least one ion beam etch (IBE) process. In an embodiment, the method step of depositing the conformal layer is performed by atomic layer deposition (ALD). In an embodiment, depositing the conformal layer of the nitride material includes depositing silicon, nitrogen and at least one dopant of carbon or boron. In an embodiment, depositing the layer of low-k oxide material includes depositing the at least one dopant of fluorine or carbon. In some implementations, the method further includes forming an inter-layer dielectric (ILD) layer over the layer of low-k oxide material.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a magnetic tunneling junction (MTJ) element over a semiconductor substrate;
   a top electrode layer over the MTJ element, wherein the top electrode layer is circular in a top view;
   a first spacer layer abutting sidewalls of the MTJ element and encasing the MTJ element such that the first spacer layer has a ring shape in a top view, wherein the first spacer layer has a first low-dielectric constant (low-k) composition;

a second spacer layer on the first spacer layer, wherein the second spacer layer has a second low-k composition, the second low-k composition different than the first low-k composition; and
an etch stop layer between the first spacer layer and the second spacer layer.

2. The semiconductor device of claim 1, wherein the first low-k composition includes silicon, oxygen, and at least one of fluorine or carbon.

3. The semiconductor device of claim 2, wherein the second low-k composition includes silicon, nitrogen, and at least one of carbon or boron.

4. The semiconductor device of claim 1, wherein the first low-k composition has a dielectric constant of less than 4 and the second low-k composition has a dielectric constant of less than 7.

5. The semiconductor device of claim 1, wherein from the top view, the circular top electrode and the ring shape first spacer layer are concentric.

6. The semiconductor device of claim 1, wherein the etch stop layer has an etch selectivity to material of the second spacer layer.

7. The semiconductor device of claim 1, wherein the first low-k composition is silicon nitride doped with carbon and the second low-k composition is silicon oxide doped with carbon.

8. The semiconductor device of claim 1, further comprising:
another MTJ element over the semiconductor substrate;
the first spacer layer abutting sidewalls of the another MTJ element and encasing the another MTJ such that the first spacer layer has another ring shape in the top view.

9. A semiconductor device, comprising:
a first metallization layer formed over a semiconductor substrate, wherein the first metallization layer has a first portion in a memory region and a second portion in a logic region;
a memory structure in the memory region including:
a bottom electrode extending from the first portion of the first metallization layer;
a first magnetic tunneling junction (MTJ) element on the bottom electrode;
a top electrode over the MTJ element;
a first spacer layer abutting sidewalls of the first MTJ element, the bottom electrode, and
the top electrode, wherein the first spacer layer includes silicon, nitrogen, and is at least one of carbon or boron; and
a second spacer layer on the first spacer layer, wherein the second spacer layer is at least one of silicon, oxygen, and at least one of fluorine or carbon;
a via structure in the logic region extending from the second portion of the first metallization layer; and
a second metallization layer extending from the via structure, wherein the second metallization layer is coplanar with the MTJ element.

10. The semiconductor device of claim 9, further comprising: an etch stop layer interposing the first spacer layer and the second spacer layer.

11. The semiconductor device of claim 9, further comprising:
at least one dielectric layer extending from the memory region to the logic region, wherein the bottom electrode extends through the at least one dielectric layer.

12. The semiconductor device of claim 9, wherein the bottom electrode is coplanar with the via structure on a first plane, the first plane extending parallel a top surface of the semiconductor substrate.

13. A semiconductor device comprising:
a first magnetic tunneling junction (MTJ) element over a semiconductor substrate;
a top electrode layer over the first MTJ element;
a first spacer layer abutting sidewalls of the first MTJ element and encasing the first MTJ element, wherein the first spacer layer has a first low-dielectric constant (low-k) composition;
a second spacer layer on the first spacer layer, wherein the second spacer layer has a second low-k composition, wherein the second low-k composition is approximately 15% to approximately 80% lower dielectric constant than the first low-k composition; and
an etch stop layer interposing the first spacer layer and the second spacer layer.

14. The semiconductor device of claim 13, wherein the etch stop layer has an uppermost surface substantially coplanar with an uppermost surface of the second spacer layer.

15. The semiconductor device of claim 13, wherein the etch stop layer is aluminum oxide.

16. The semiconductor device of claim 13, wherein the etch stop layer has a ring shape in a top view.

17. The semiconductor device of claim 13, wherein the first low-k composition nitrogen, and at least one of carbon or boron.

18. The semiconductor device of claim 13, further comprising:
an array of MTJ elements including the first MTJ element and a second MTJ element; and
wherein the etch stop layer has a first portion forming a ring shape in a top view, the first portion forming the ring shape surrounding the first MTJ element and wherein the etch stop layer has a second portion forming a ring shape in the top view, the second portion forming the ring shape surrounding the second MTJ element.

19. The semiconductor device of claim 18, wherein the ring shape surrounding the first MTJ element and the ring shape surrounding the second MTJ element are spaced a distance in the top view.

20. The semiconductor device of claim 19, wherein the second spacer layer extends in the distance.

* * * * *